United States Patent [19]

Tyan et al.

[11] 4,315,096  
[45] Feb. 9, 1982

[54] INTEGRATED ARRAY OF PHOTOVOLTAIC CELLS HAVING MINIMIZED SHORTING LOSSES

[75] Inventors: Yuan-Sheng Tyan, Webster; Evelio A. Perez-Albuerne, Rochester, both of N.Y.

[73] Assignee: Eastman Kodak Company, Rochester, N.Y.

[21] Appl. No.: 172,117

[22] Filed: Jul. 25, 1980

[51] Int. Cl.³ .................. H01L 31/04; H01L 31/18
[52] U.S. Cl. .................................... 136/244; 29/572; 29/580; 29/583; 136/249; 357/30
[58] Field of Search ............. 136/244, 249, 260, 258; 29/572, 580, 583; 427/74; 357/30

[56] References Cited

U.S. PATENT DOCUMENTS

| | | | |
|---|---|---|---|
| 2,428,537 | 10/1947 | Veszi et al. | 136/244 |
| 3,483,038 | 12/1969 | Hui et al. | 136/244 |
| 3,571,915 | 3/1971 | Shirland | 29/572 |
| 3,574,925 | 4/1971 | Schneider et al. | 29/487 |
| 3,849,880 | 11/1974 | Haynos | 29/626 |
| 3,988,167 | 10/1976 | Kressel et al. | 136/256 |
| 3,994,012 | 11/1976 | Warner, Jr. | 136/246 |
| 4,035,197 | 7/1977 | Raychoudhuri | 136/255 |
| 4,042,418 | 8/1977 | Biter | 136/249 |
| 4,127,424 | 11/1978 | Ullery, Jr. | 136/244 |
| 4,129,458 | 12/1978 | Kaplow et al. | 136/246 |
| 4,131,984 | 1/1979 | Kaplow et al. | 29/572 |
| 4,162,174 | 7/1979 | Kaplow et al. | 136/246 |
| 4,207,119 | 6/1980 | Tyan | 136/258 |
| 4,233,085 | 11/1980 | Roderick et al. | 136/244 |
| 4,243,432 | 1/1981 | Jordan et al. | 136/244 |
| 4,245,386 | 1/1981 | Kausche et al. | 29/572 |
| 4,249,959 | 2/1981 | Jebens | 136/244 |

FOREIGN PATENT DOCUMENTS

| | | | |
|---|---|---|---|
| 783886 | 8/1978 | South Africa | 136/244 |
| 1010476 | 11/1965 | United Kingdom | 136/249 |
| 1351454 | 5/1974 | United Kingdom | 136/249 |

OTHER PUBLICATIONS

M. Sayed et al., "Effect of Shading on CdS/LuxS Solar Cells and Optimal Solar Array Design", *Energy Conversion*, vol. 15, pp. 61–71 (1975).

S. F. DiZio, "Initial Production of CdS Photovoltaic Products", *Record, Annual Meeting Solar Energy Society*, Winnipeg, Canada (1976), pp. 108–112.

Primary Examiner—Aaron Weisstuch
Attorney, Agent, or Firm—Dana M. Schmidt

[57] ABSTRACT

There are disclosed an integrated array of photovoltaic cells each comprising, on a support, a first electrode segment, a semiconductor segment, and a second electrode segment; and a process for making it, wherein no insulating material need be applied to exposed semiconductor materials before applying the second electrode segment. The array is composed of sub-cells, groups of which are series-connected to form sub-arrays. The sub-arrays are in turn connected in parallel so that a short in any one sub-cell only minimally affects the output of the entire array.

11 Claims, 8 Drawing Figures

INTEGRATED ARRAY OF PHOTOVOLTAIC CELLS HAVING MINIMIZED SHORTING LOSSES

FIELD OF THE INVENTION

This invention relates to an integrated array of photovoltaic cells, and to a method of making the array.

BACKGROUND OF THE INVENTION

In recent years, a number of marked advances have been made in the state of the art of inorganic solar cells. Notably, conversion efficiencies have been improved above the 5% level. Examples of such improved cells are given in U.S. Pat. Nos. 4,035,197 and 4,207,119, issued on July 12, 1977 and June 10, 1980, respectively.

However, before such cells can significantly replace more conventional power sources, a series-connected array of such cells is needed with significantly greater voltage outputs than an open-circuit voltage of 800 mV that can now be achieved from a single cell.

Although arrays of photovoltaic cells have been constructed, they have been beset with problems that have prevented significant commercialization. For example, arrays of series-connected solar cells have been constructed wherein the positive and negative electrodes of adjacent cells are mechanically joined together. Representative examples appear in U.S. Pat. No. 3,571,915, issued Mar. 23, 1971. Such cells have the disadvantage that mechanical connection of opposite electrodes results in wasted space between cells and less than the maximum packing density of cells per unit width of array. Furthermore, mechanical bonding of the electrodes is very time consuming and labor intensive, compared to step-to-step deposition processes that can be used for the remainder of the fabrication.

One approach to fabricating integrated arrays is to coat the active layers of the cells by a deposition from the vapor phase without using masks. Undesired portions are then removed. Examples of such an approach are disclosed in South African Pat. No. 78/3886. However, before the last electrode layer is applied, insulting beads are deposited along the exposed edges of the semiconductor strips, to prevent the last electrode layer from contacting the semiconductor portions of two adjacent cells, as would otherwise necessarily occur in an overall deposition coating that is, otherwise free of masks. One reason for this step is that both lower electrodes of two adjacent cells are exposed by the removal of the semiconductor material. Also, at least a portion of the semiconductor material, usually the p-type material in a heterojunction cell, has a conductivity that provides insufficient resistance to shorting in the event the outer electrode of two adjacent cells contacts the low-resistance material. However, the use of such beads of insulation represents a separate processing step requiring great care and precision, and accordingly produces a marked increase in the cost of the manufacturing process and materials.

Additional problems occurring with the simultaneous assembly of integrated arrays is the difficulty in detecting a short circuit in an individual cell prior to its assembly in the array. Once assembled, a short will show up as a power loss, but its exact location in the array is indeterminable, preventing it from being operatively removed from the array.

Therefore, there has been a need, prior to this invention, to reduce the cost of manufacturing integrated arrays, and at the same time to provide a technique for electrically isolating shorts when they occur in such arrays.

SUMMARY OF THE INVENTION

In accord with the present invention, there is advantageously featured an integrated array of photovoltaic cells designed to permit fabrication by coating the entire surface of the array without the need for protective insulative strips at the edges of individual semiconductor strips.

More specifically, there are provided an improved array, and method of manufacture, of series-connected, elongated cells on an insulative support, the majority of cells together comprising a plurality of spaced-apart segments of a first electrode material on the support, a plurality of semiconductor segments disposed in contact each with at least a portion of one of the electrode segments and comprising a layer of semiconductor material having a resistance high enough to prevent shorting between said electrode segments, and a plurality of segments of a second electrode material. The semiconductor segments are disposed to leave exposed a portion of the first electrode segments. The second electrode segments each contact a semiconductor segment and the exposed portion of the first electrode segment of the cell adjacent thereto. The array and method of manufacture are improved in that there is no attempt to prevent, and indeed the coating produces, when finally assembled, a bridging of adjacent semiconductor segments by the second electrode. The second electrode segments of each cell are isolated from the second electrode segment of the adjacent cell by a groove that extends down to at least the high-resistance semiconductor layer. It is the high resistance of the remaining semiconductor material in cooperation with the structure that avoids the need for insulative beads.

In accordance with a related aspect of the invention, there is advantageously featured such an array wherein inadvertent short circuits are automatically isolated to minimize the power loss of the array. More specifically, in addition to the steps of alternatively applying the layers to the support and removing portions of the layers as is necessary to simultaneously form, for all cells, the first electrode, semiconductor material, and second electrode, the method and array feature the dividing of each of the series-connected cells into a plurality of electrically isolated sub-cells. Groups of sub-cells thus form series-connected sub-arrays, the sub-arrays being connected in parallel by electrical contacts at opposite ends of each sub-array.

In accordance with yet another aspect of the invention, there is advantageously featured an array of cells on a support having an insulating surface, the cells comprising a first electrode layer, a semiconductor layer and an overlying second electrode layer. The array is improved by insulating the second electrode layer between adjacent cells by an air space and by the semiconductor layer, such semiconductor layer being selected to be a high-resistance semiconductor layer.

Other features and advantages will become apparent upon reference to the following description of the preferred embodiments, when read in light of the attached drawings.

DESCRIPTION OF THE PREFERRED EMBODIMENTS

"Photovoltaic cell" as used herein means a solidstate device producing an electric current in response to light of appropriate wavelengths, from any source. A "sub-cell" is a portion of such a cell, electrically isolated from other sub-cells of that cell and preferably formed by a process hereinafter described.

It has been found that an integrated array can be manufactured with simultaneous assembly of all the cells using complete coating coverage for each layer, without the need for protective insulative beads or critical alignment of separation grooves, provided that at least a portion of each of the semiconductor segments is a high-resistance layer, and the outermost electrodes of adjacent cells are separated by a groove that extends down to at least the semiconductor material to form an insulating air space.

It has further been found that dividing these series-connected cells into a plurality of sub-cells series-connected to form sub-arrays that are connected in parallel to form the array, minimizes the effects of any short circuits.

Figure 1:
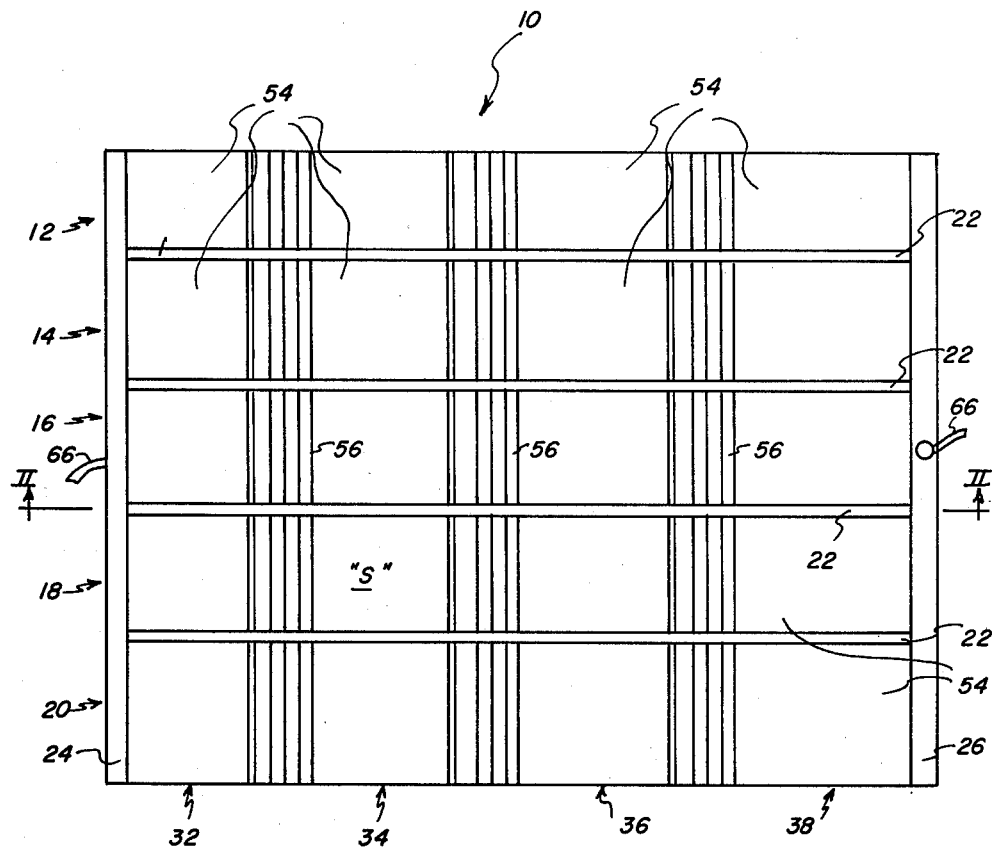
FIG. 1 is a plan view of an array prepared in accordance with the invention.

As shown in FIG. 1, in accord with one aspect of the invention, an array 10 comprises a plurality of sub-arrays 12, 14, 16, 18, and 20 here shown as five in number, of individual series-connected sub-cells. Each sub-array is preferably in the form of a row, electrically isolated from the adjacent sub-arrays by a groove 22 that extends down to, and preferably into, an insulative support 40, shown in FIG. 2, that mounts all of said sub-cells. However, the sub-arrays are connected in parallel by virtue of individual common electrical contact structure. "Electrical contact structure" is that structure which permits electrical connection of the array to other electrical elements. In this embodiment, it comprises contacts 24 and 26 mounted across respective opposite ends of the array, in electrical low-resistance contact with respective opposite electrodes of each sub-array.

Each of the sub-cells of a sub-array is preferably also a sub-cell of one of a plurality of parent cells 32, 34, 36 and 38, such parent cells being formed as hereinafter described. "Parent cell" as used herein refers to a predecessor photovoltaic cell construct from which sub-cells are derived by division.

The number of sub-arrays and parent cells is not crucial, except that the more parent cells there are, the greater will be the voltage output of the overall array as the greater will be the number of cells connected in series. Also, the greater the number of sub-arrays, the less effect a given short circuit in any sub-cell will have on the power output.

Figure 2:
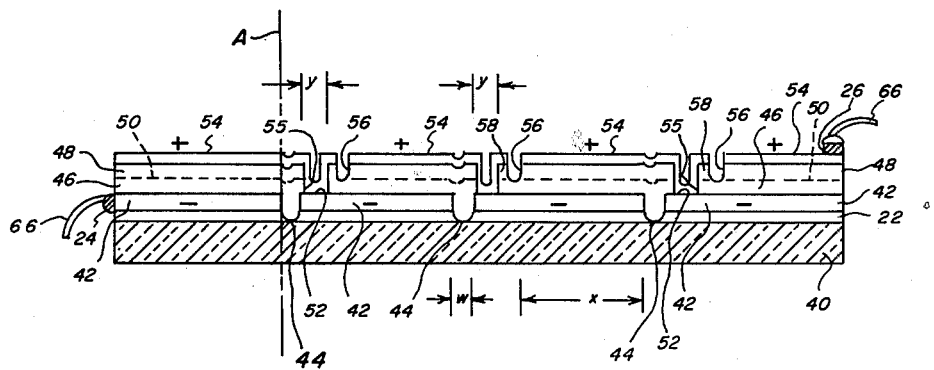
FIG. 2 is a section view taken generally along the line II—II of FIG. 1.

Each sub-cell of each sub-array comprises, FIG. 2, a lower or first electrode segment 42 separated from the electrode segments 42 of sub-cells of adjacent sub-arrays by grooves 22, and from adjacent parent cells by grooves 44. When applied to the support, electrode segments 42 are preferably formed from a single layer 42', as is explained hereinafter. Next, each sub-cell comprises semiconductor segments which, as shown in FIG. 2, are preferably divided into two layers 46 and 48 of two different materials with a rectifying junction 50 between them. An example of layer 46 is high-resistance n-type CdS, and an example of layer 48 is p-type CdTe. Particularly useful examples are described in the aforesaid U.S. Pat. No. 4,207,119, the details of which are expressly incorporated herein by reference. Other useful examples include amorphous silicon, and GaAs/GaAlAs. Layer 46 contacts at least a portion of the exposed surface of electrode segments 42 as well as support 40 in grooves 44. The resistance of the semiconductor material in at least layer 46 is sufficiently high as to prevent shorting across the semiconductor material between adjacent electrodes 42. As used herein, "shorting" means that condition that exists when the loss in power or current, measured at the power point, due to the short, is at least about 50% of the total power or current that would otherwise be available from the cell if not shorted.

Each of the semiconductor segments formed by layers 46 and 48 is spaced from the semiconductor segments of adjacent sub-arrays by grooves 22, and from the semiconductor segments of adjacent columns by a spacing "y", FIG. 2, that leaves exposed or uncovered a portion 52 of each first electrode segment. Preferably, each exposed electrode portion 52 is adjacent one edge, and always the same edge, of each electrode segment from parent cell to parent cell.

Finally, each sub-cell is completed by a segment 54 of an outer or second electrode material. Except for parent cell 38, electrode segments 54 are in contact with (a) at least a portion of the exposed surfaces of a pair of semiconductor segments in two adjacent sub-cells of a sub-array, and (b) with the uncovered portion 52 of the first electrode segment 42 of the next adjacent sub-cell of that sub-array, providing the series connection within that sub-array. Because the spacing "y" between semiconductor segments of adjacent sub-cells of a sub-array is free of insulating material, electrode segments 54 also contact at least one and preferably both layers 46 and 48 at edge surfaces 55 thereof. Electrode segments 54 of parent cell 38, on the other hand, need not contact any layer except the semiconductor segments of that cell.

To electrically isolate and separate electrode segments 54 from each other in a given sub-array of sub-cells, a groove 56 is provided through the electrode layer used to form the segments. To prevent shorting between adjacent electrode segments 54 in a sub-array, through semiconductor layer 48, grooves 56 are extended down to and preferably into at least the high-resistance layer 46. The need for insulating beads along edge surfaces 55 is thus avoided.

The specific material for each of the electrode segments and semiconductor layers is not crucial and can be selected from a variety of conventional, preferably coatable, materials. Because of the advantages obtained from thin-film coatings, preferably layers 46 and 48 are polycrystalline material, as described, for example, in the aforesaid U.S. Pat. No. 4,207,119. The materials for electrode segments 42 and 54 are selected to provide, at least in the array of FIG. 2, a contact having low electrical resistance with the adjacent semiconductor layer. In this manner, the semiconductor materials and the electrode materials are effective to provide a photovoltaic effect.

The effective length of each sub-cell for each sub-array is indicated as distance "x", FIG. 2, measured between grooves 44 and 56 of a given sub-cell. That is, portions 58 of semiconductor material left between grooves 56 and the grooves that expose the portions 52 of the first electrode, are shorted out by electrode 54.

In accordance with another aspect of the invention, a method is provided for preparing such an array which comprises the steps, FIGS. 3–6, of applying sequential layers to form the sub-cells. Between layer application, portions of the just-deposited layer are removed to define sub-cells within each sub-array and to permit series connection of the sub-cells.

Figure 3:
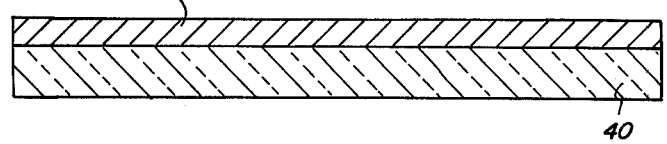
FIGS. 3-6 are section views similar to that of FIG. 2, but illustrating sequential steps in the method of manufacture.

More specifically, as shown in FIG. 3, a layer 42' of first electrode material is applied, such as by depositing, to the entire area of support 40. Thereafter, grooves 44 are formed (FIG. 4) by removing portions of layer 42', and optionally the underlying support, preferably along substantially parallel lines, leaving isolated, generally elongated electrode segments 42 and exposed support portions. Next, a layer 46 of high-resistance semiconductor material is applied to all of the electrode segments 42, and to the exposed support portions at the bottom of grooves 44. Over this is applied, such as by depositing, a layer 48 of semiconductor material capable of forming a rectifying junction 50 with layer 46. Thereafter, FIG. 6, portions of both of the semiconductor layers are removed preferably along substantially parallel lines to form grooves 60 extending generally parallel to, but offset from, grooves 44. Grooves 60 are sufficiently deep to expose portions 52 of electrode segments 42. Grooves 60 are shown as extending the full length of the array in a manner similar to grooves 44, but this is not necessary. That is, the function of grooves 60 is to permit series connection of the sub-cells of a sub-array. Therefore, groove 60 need not be continuous the full distance across each sub-array between isolating grooves 22. However, each groove 60 must at least expose a portion 52 of electrode segments 42 for each of the sub-arrays 12, 14, etc. of sub-cells. No groove 60 is needed for the left-hand edge of the array, FIG. 6, that is to eventually form parent cell 32.

Figure 6:
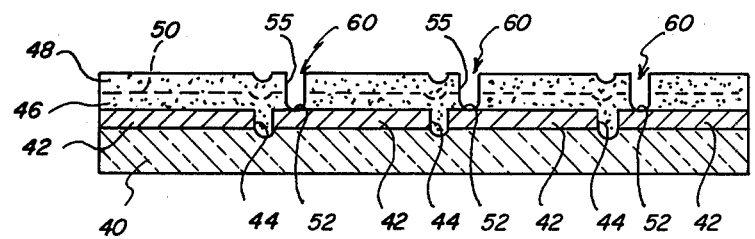

Thereafter, a layer of the second electrode material is applied over the entire array area, so as to bridge and contact the semiconductor segments of adjacent parent cells and to contact at least one and preferably both of the semiconductor layers 46 and 48 at edge surfaces 55, and first electrode segment portions 52, FIG. 2, that are exposed in grooves 60 formed as described for FIG. 6. Grooves 56 are then formed, FIG. 2, by removing at least portions of the second electrode layer, and any semiconductor layer that is not a high-resistance material. Grooves 56 are generally parallel to grooves 60 and offset therefrom, exposing at least the high-resistance semiconductor material. It is preferred that grooves 56 be closer to the grooves 60 exposing electrode portions 52, than they are to grooves 44. A plurality of series-connected parent cells is thus formed.

Finally, electrical contacts 24 and 26 are bonded to electrode segments 42 of parent cell 32 and to electrode segments 54 of parent cell 38, respectively. The array is now operative and the thus-formed cells 32, 34, 36 and 38 are connected in series.

Further improvement is obtained by removing portions of all electrode segments 42, layers 46 and 48 and electrode segments 54, along substantially parallel grooves 22 extending into support 40 substantially perpendicularly to grooves 44 and 56, thereby dividing the cells, but not the contacts 24 and 26, into parallelly connected sub-arrays 12, 14, 16, 18 and 20, the sub-cells in each sub-array being series-connected. If then a short occurs in one of the sub-cells, labeled "S" in FIG. 1, then only sub-array 18 will be reduced in power rather than the entire output of parent cell 34.

Optional lead wires 66 connect the output electrodes of the array to other electrical components.

Alternatively, array 10 is constructed so that the first parent cell, when viewed left to right, FIG. 2, is cell 34 rather than cell 32. The left-hand edge in such a case falls at phantom line "A". Such a design permits the contact structure, for the negative electrode segments 42, to be electrode segment 54 at line A, which in this embodiment is not severed by grooves 22 but extends continuously along the edge at line A. The advantage is that lead wire 66 can be bonded from the top, rather than the side, of the array.

A preferred method of applying each of the described layers is by depositing the material from the vapor phase, such as by vacuum deposition of the electrode layers and by close-space sublimation (CSS) of the semiconductor layers. Preferably sublimation occurs at a pressure between about $10^{-6}$ and about 100 torr, and most preferably is at a pressure between about $10^{-5}$ and about 10 torr. The spacing between the semiconductor material source and the substrate onto which the material is deposited, such as segments 42, preferably is between about 0.5 and about 5 mm. The semiconductor material is deposited preferably for a time of between about 0.1 sec to about 10 minutes with the substrate maintained at a temperature of between about 300° C. and about 650° C. As is customary in sublimation, the source temperature is maintained in each instance between about 10° and about 500° C. higher than the electrode segment temperature. Conventional heating techniques for the source and/or the substrate include, e.g., resistance heating, induction heating, and the like.

Figure 4:
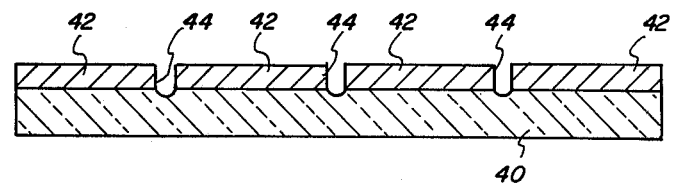
Figure 5:
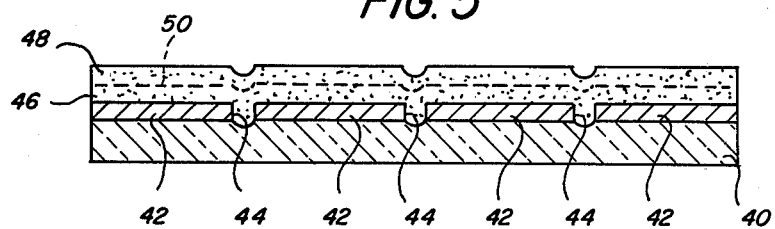

Any method of removal can be used to form grooves 44, 60, 56 and 22. Highly preferred are mechanical removal, such as by scribing the layers to be removed, and removal techniques using radiant energy, such as a focused laser beam. Also useful are the steps of selectively and photographically forming a protective resist layer and etching through the resist to remove the portions that form the grooves. The width of the grooves, such as width "w" of grooves 44, FIGS. 2 and 4, is not critical. Representative values for "w" are between about $5\mu$ and about $100\mu$.

The location of grooves 44 as determined by the removal steps is preferably selected so that the distance between groove 44 of column 32 and electrical contact 24 is less than the distance between groove 44 of column 38 and contact 26, so that the effective width "x" for each cloumn of sub-cells segments is about the same.

The exact location of grooves 56 can be varied slightly. Ideally, ineffective portions 58 of the semiconductor material should be minimized, FIG. 2. However, if a groove 56 were to accidentally coincide with the groove 60 that permitted contact between electrode segments 54 and 42, the series connection could be destroyed. Therefore, it is preferred for ease in manufacturing that some portion of each semiconductor segment be contacted by the electrode segment 54 from the adjacent cell.

Figure 7:
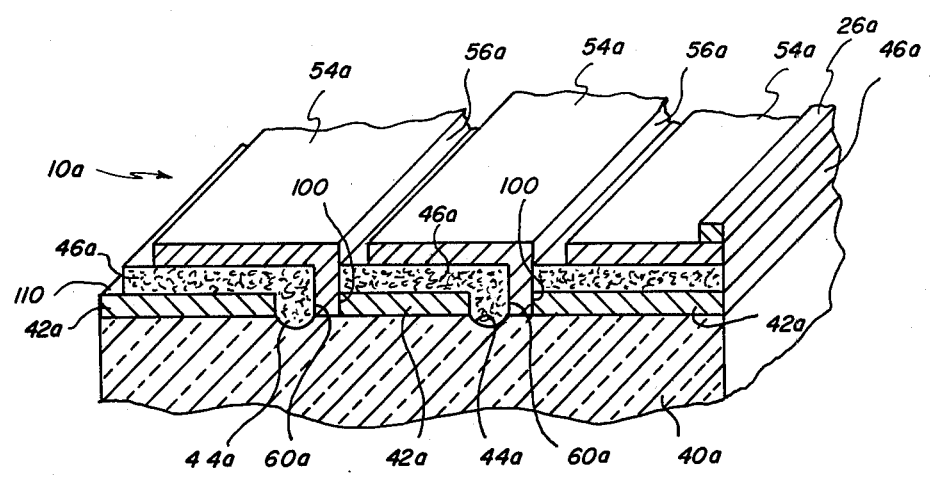
FIG. 7 is a fragmentary perspective view, partially in section, of an alternate embodiment of the invention.

The embodiment of FIG. 7 illustrates that the series connection of adjacent sub-cells in a sub-array can be made at the exposed edge surface of the first or lower electrode segment, and that in certain instances the groove separating the second electrode segments need not remove any semiconductor materials. Parts similar to those previously described bear the same reference numeral to which a distinguishing suffix "a" is added.

Thus, as with the previous embodiment, each sub-array of the array 10a comprises, on support 40a, electrode segments 42a separated by grooves 44a. The semiconductor segments comprise a single high-resistance layer 46a, and the semiconductor removal step produces grooves 60a that go down to the support 40a, removing also a portion of the electrode segments 42a. The result is that the application of the layer that forms electrode segments 54a produces a portion thereof that contacts the exposed support and the edge portion 100 of electrode segments 42a. All of the semiconductor segments 46a are formed to provide a highresistance layer, and grooves 56a extend only through the layer of second electrode material. The high resistance of layer 46a prevents shorting from occurring between electrode segments 54a. Because only one semiconductor material is used for layer 46a, electrode segments 54a are selected from a metal that forms a rectifying junction with semiconductor segments 46a. For example, the cell segments can be Schottky barrier cells wherein layer 46a is n-type CdTe and electrode segments 54a are appropriate barrier metals. Portion 110 of electrode segment 42a can be used as one contact, and contact 26a can be provided as described for the previous embodiment.

Figure 8:
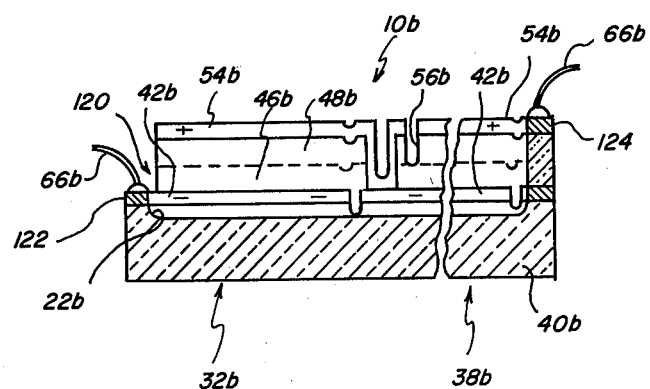
FIG. 8 is a fragmentary section view similar to that of FIG. 2, but illustrating yet another alternate embodiment.

The embodiment of FIG. 8 illustrates an electrical contact structure at opposite ends of the array comprising the positive and negative electrode segments themselves, without the need for additional contact strips. Parts similar to those previously described bear the same reference numeral to which the distinguishing suffix "b" is added. Thus, as with the embodiment of FIG. 2, each sub-cell of the array 10b comprises, on support 40b, a first electrode segment 42b, one or more semiconductor layers 46b and 48b, and second electrode segments 54b. Grooves 56b are formed as before, as are the other isolating grooves that result in a series connection of electrode segments 54b and 42b between adjacent sub-cells of a sub-array. However, a groove 120 is formed along at least a portion of parent cell 32b to eliminate all but the electrode segment 42b from the outermost edge of that parent cell. Grooves 22b are then formed similarly as before, except that they terminate short of the opposite ends, leaving portions 122 and 124, respectively, of electrode segments 42b and 54b to extend continuously the full length of the array. It is these portions that comprise the electrical contact structure for lead lines 66b of this embodiment.

EXAMPLE

An array was prepared as described for the array of FIG. 1, the cells being heterojunction cells the materials and method of deposition of which were selected as described in the aforesaid U.S. Pat. No. 4,207,119 to form a backwall array. The number of series-connected cells in each sub-array was 12 and the total array area was 30 cm$^2$. On a sunny day in March, the array produced an open-circuit voltage ($V_{oc}$) of 7.86 volts and a short-circuit current ($I_{sc}$) of 33.4 mA, when the array was mounted in a horizontal orientation. The total incident radiation was measured to be about 55.2 mW/cm$^2$, and the cells demonstrated a fill factor of about 0.528 when measured in AM2 simulated sunlight of similar intensity. Therefore, the conversion efficiency of the entire array was about 8% under solar illumination.

The invention has been described in detail with particular reference to preferred embodiments thereof, but it will be understood that variations and modifications can be effected within the spirit and scope of the invention.

What is claimed is:

1. In an array comprising an insulative support and generally elongated photovoltaic cells connected in series on the support, the majority of said cells together comprising:
   (1) a plurality of spaced-apart segments of a first electrode material disposed on said support;
   (2) a plurality of semiconductor segments, each of said semiconductor segments
      (a) being disposed in contact with and overlying all but an edge portion of a segment of said electrode material, and in contact with a portion of the support,
      (b) comprising a layer of semiconductor material having a resistance high enough to prevent a short between adjacent electrode segments, and
      (c) having edge surfaces spaced from the edge surfaces of adjacent semiconductor segments; and
   (3) a plurality of spaced-apart segments of a second electrode material, each of said second electrode segments overlying and contacting at least a portion of a semiconductor segment, and contacting said edge portion of said first electrode segment of an adjacent cell,
   said electrode segments and said semiconductor segments being effective to provide a photovoltaic effect therebetween;
   the improvement wherein each of said second electrode segments contacts two adjacent semiconductor segments, and adjacent second electrode segments are separated by a groove that extends down to at least said high-resistance semiconductor layer,
   whereby shorting between said second electrode segments through said semiconductor segments is substantially prevented.

2. An array as defined in claim 1, wherein said semiconductor segments comprise an n-type cadmium compound.

3. An array as defined in claim 2, wherein said n-type compound is CdS, and further including segments of p-type CdTe sandwiched between said n-type CdS segments and said second electrode segments.

4. An array as defined in claim 2, wherein said semiconductor segments are formed of a single layer, comprising n-type CdTe, and said second electrode segments are selected to form a rectifying junction with said CdTe.

5. An array as defined in claim 1, wherein said first and second electrode segments and said semiconductor segments are substantially parallel to each other.

6. An array as defined in claim 1, wherein said second electrode segments are disposed to be offset from the semiconductor segments underlying them.

7. An array as defined in claim 1, 2, 5 or 6, wherein said segments are generally elongated strips.

8. An array as defined in claim 1, wherein said cells are disposed as sub-cells distributed in a plurality of sub-arrays, the sub-cells of each sub-array being connected in series and electrically separated from sub-cells of adjacent sub-arrays by grooves extending to said support, and further including first and second electrical contact structure joining together all of the sub-arrays only at opposite ends of said sub-arrays, whereby said array comprises a parallel connection of sub-arrays comprised of series-connected sub-cells.

9. An array as defined in claim 1, and further including first and second contacts joined to said first and second electrodes, respectively, at opposite ends of the array for collecting current flow at said ends.

10. In a process of producing an array of series-connected, photovoltaic cells on a support each cell comprising a first electrode material, at least one semiconductor material, a second electrode material in contact with the first electrode material of an adjacent cell, and electrical contact structure provided at the first and second output electrodes located at opposite ends of the array for collecting current flow at said ends; the process comprising the steps of applying in sequential, overlying layers the first electrode material, the semiconductor material, and the second electrode material on an insulative support, so that said second electrode material of each cell is series-connected with the first electrode material of only one adjacent cell;

the improvement comprising the step of dividing each of said cells, but not said contact structure, into a plurality of electrically isolated sub-cells so that a parallel connection of series-connected sub-arrays of sub-cells is formed, whereby any short-circuited portion of a sub-cell in one sub-array does not substantially affect the output of other sub-arrays.

11. A process of producing an array having a predetermined overall area, of series-connected, elongated photovoltaic cells each comprising a first electrode material, a high-resistance semiconductor material, a second electrode material in contact with the first electrode material of an adjacent cell, and electrical contact structure provided at said first and second electrodes, respectively, at opposite ends of the array for collecting current flow at said ends; the process comprising the steps of (a) depositing over said overall area an overlying layer of said high-resistance semiconductor material onto spaced segments of said first electrode material mounted on an insulating support and onto portions of said support, (b) removing, for a majority of said cells, portions of said semiconductor material to expose a portion of each said segment of first electrode material and to form a pair of opposed side surfaces of said semiconductor layer above each said segment of first electrode material of said cell majority, (c) depositing over said overall area said second electrode material in overlying contact with the exposed surfaces of said semiconductor layer, including said opposed side surfaces, and said exposed portions of said first electrode material, and (d) removing, for each of said cells, at least a portion of said second electrode material to expose at least said high-resistance semiconductor material.

* * * * *